United States Patent
Henry et al.

(10) Patent No.: US 10,403,537 B2
(45) Date of Patent: Sep. 3, 2019

(54) INORGANIC LIGHT EMITTING DIODE (ILED) ASSEMBLY VIA DIRECT BONDING

(71) Applicant: Facebook Technologies, LLC, Menlo Park, CA (US)

(72) Inventors: William Padraic Henry, Cork (IE); Patrick Joseph Hughes, Cork (IE); Vincent Brennan, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 109 days.

(21) Appl. No.: 15/456,419

(22) Filed: Mar. 10, 2017

(65) Prior Publication Data

US 2018/0261582 A1    Sep. 13, 2018

(51) Int. Cl.

| | |
|---|---|
| *H01L 21/683* | (2006.01) |
| *H01L 33/40* | (2010.01) |
| *H01L 33/00* | (2010.01) |
| *H01L 27/12* | (2006.01) |
| *H01L 33/62* | (2010.01) |
| *H01L 33/20* | (2010.01) |
| *H01L 25/075* | (2006.01) |

(52) U.S. Cl.
CPC ...... *H01L 21/6835* (2013.01); *H01L 27/1214* (2013.01); *H01L 33/0095* (2013.01); *H01L 33/405* (2013.01); *H01L 33/62* (2013.01); H01L 25/0753 (2013.01); H01L 33/20 (2013.01); H01L 2221/68354 (2013.01); H01L 2221/68368 (2013.01); H01L 2221/68381 (2013.01); H01L 2933/0066 (2013.01)

(58) Field of Classification Search
CPC . H01L 2221/68318; H01L 2221/68368; H01L 21/6835; H01L 25/0753
See application file for complete search history.

(56) References Cited

U.S. PATENT DOCUMENTS

| | | | |
|---|---|---|---|
| 6,214,733 B1 * | 4/2001 | Sickmiller | .......... H01L 21/6835 438/458 |
| 2017/0170141 A1 * | 6/2017 | Oppermann | ........ H01L 21/6835 |
| 2017/0215280 A1 † | 7/2017 | Chaji | |
| 2017/0338374 A1 * | 11/2017 | Zou | ...................... H01L 33/0079 |
| 2018/0006083 A1 * | 1/2018 | Zhu | ......................... H01L 22/22 |

\* cited by examiner
† cited by third party

*Primary Examiner* — Marcos D. Pizarro
*Assistant Examiner* — Antonio B Crite
(74) *Attorney, Agent, or Firm* — Fenwick & West LLP

(57) ABSTRACT

Embodiments relate to transferring dies or other electronic components from a carrier substrate to a target substrate of a device as part of chip assembly for the device. Bonding material is applied to selected dies on a carrier substrate by direct boning, or to corresponding die transfer locations on a target substrate. The carrier substrate is then brought into contact with the target substrate to transfer each of the selected dies to the carrier substrate. Dies can also be directly bonded to the target substrate even in the presence of other die in situ (e.g., from a previous bonding cycle), hence, enables more than one direct bond cycle to be carried out for a target substrate. As such, multi-color (RGB) display elements can be assembled in stages (e.g., separate bonding cycles) in a flexible manner to provide redundancy or to replace inoperative LED dies.

20 Claims, 14 Drawing Sheets

|   | 1 | 2 | 3 | 4 | 5 | 6 | 7 |
|---|---|---|---|---|---|---|---|
| 1 | o | o | o | o | o | o | o |
| 2 | o | o | o | o | o | o | o |
| 3 | x | x | x | x | x | x | x |
| 4 | x | x | x | x | x | x | x |
| 5 | x | x | x | x | x | x | x |
| 6 | x | x | x | x | x | x | x |
| 7 | o | o | o | o | o | o | o |

Fig. 10

INORGANIC LIGHT EMITTING DIODE (ILED) ASSEMBLY VIA DIRECT BONDING

BACKGROUND

Displays are ubiquitous and are a core component of wearable devices, smart phones, tablets, laptops, desktops, TVs and display systems. Common display technologies today range from Liquid Crystal Displays (LCDs) to more recent Organic Light Emitting Diode (OLED) displays and Active Matrix Organic Light Emitting Diode (AMOLED) displays.

Inorganic Light Emitting Diodes (ILEDs) are emerging as the third generation of flat display image generators based on superior battery performance and enhanced brightness. The ILED display has similarities to the OLED (organic LED) display in that it is self-emissive and current driven. The OLED concept is based on passing current through organic or polymer materials that is sandwiched between two glass planes to produce light. The ILED displays replace the organic LED material with a discrete standard LED (which is made of inorganic materials) at each pixel of the display (each pixel includes at least one Red, Green and Blue LED for color displays).

However, ILED displays differ from OLED displays in that the OLED material is fabricated or deposited directly onto the display substrate. In contrast, ILED devices are fabricated separately from the display. ILED devices' base material is grown on a crystalline carrier to form an LED starter wafer. This LED starter wafer is then processed through various steps to produce individual LED dies. Once fabricated the LED dies are assembled onto the display substrate to form the display or a display element, which is a part of a display comprising a plurality of LED dies positioned on a display substrate to form pixels or sub-pixels of a display. A final display may comprise one or more display elements.

The process of assembling (or manufacturing) a display element by transferring LED dies from a carrier substrate to a display substrate may include the use of a Pick Up Tool (PUT) that is configured to pick up LED dies from the carrier substrate, transfer them to the display substrate and place them on the display substrate, a process termed "pick-and-place." The process used for the Pick-and-Place of LED dies in an ILED display is a factor in determining the time and the complexity of the display manufacturing process.

SUMMARY

Techniques for manufacturing a device using direct bonding. Some embodiments include a method for manufacturing a device that includes dies on a target substrate of the device. For example, the target substrate may be a display substrate of a display device that provides mechanical attachment and electrical connection for LED dies of the display device. The method includes applying a bonding material to a subset of LED dies on a carrier substrate for transfer to a target substrate, or to corresponding selected die transfer locations on the target substrate. The bonding material can be applied to the LED dies, the die transfer locations, or both.

The bonding material provides an adhesive force that is greater than an adhesive force between the subset of LED dies and the carrier substrate. Subsequent to applying the bonding material, the carrier substrate and the target substrate are brought into contact such that the bonding material is between the subset of LED dies on the carrier substrate and the selected die transfer locations on the target substrate. The subset of LED dies is bonded to the target substrate with the bonding material, and the target substrate is separated from the carrier substrate such that the subset of LED dies are transferred to the target substrate, and may remain on the target substrate.

In some embodiments, after separating the target substrate and the carrier substrate, some or all of the remaining LED dies on the carrier substrate may be transferred to a second target substrate using a direct bonding. As additional LED dies are transferred to target substrates, larger spaces are opened between the remaining LED dies on the carrier substrate. The spaces allow for easier alignment and prevention of spatial interference during direct bonding cycles when target substrates include in-situ dies (e.g., from a previous bonding cycle).

BRIEF DESCRIPTION OF THE DRAWINGS

FIG. 10 is a schematic representation of an alignment of an in situ μLED on a target substrate relative to the remaining μLEDs on a carrier substrate, in accordance with one embodiment.

DETAILED DESCRIPTION

Figure 1:
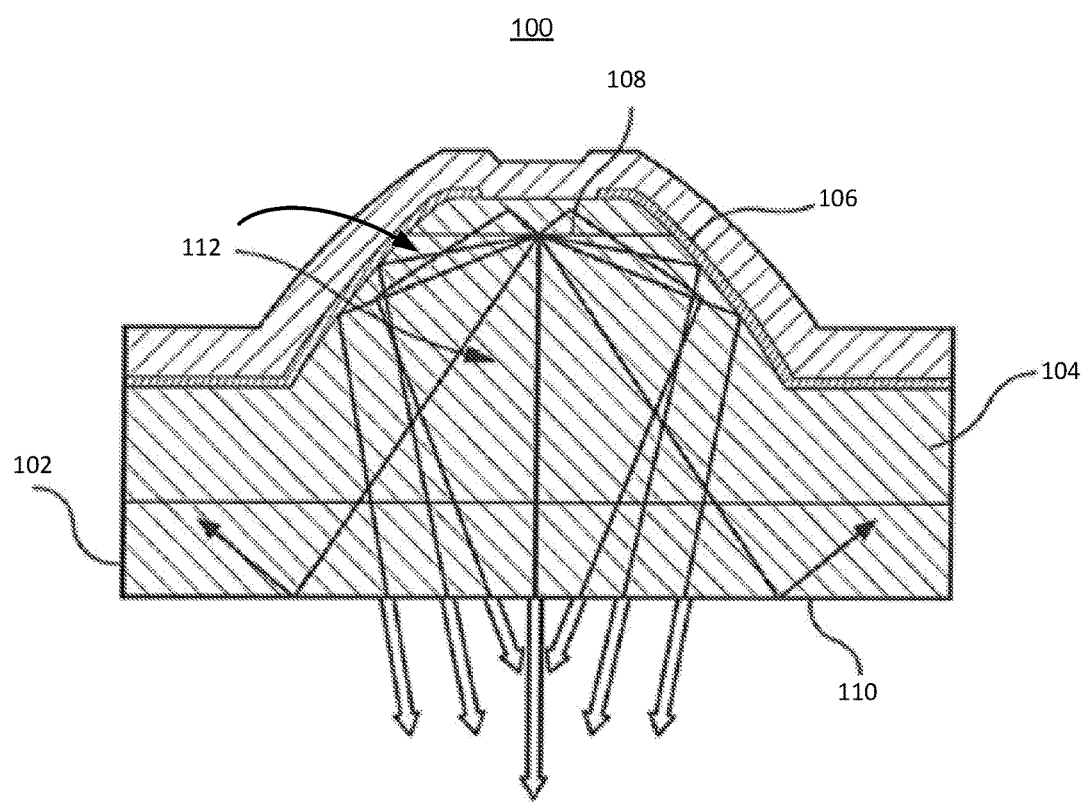
FIG. 1 is a schematic cross section of an example μLED, in accordance with one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to transferring dies or other electronic components from a carrier substrate to a target substrate of a device as part of chip assembly for the device. Bonding material is applied to selected dies on a carrier substrate, or to corresponding die transfer locations on a target substrate. The carrier substrate is then brought into contact with the target substrate to transfer each of the selected dies to the carrier substrate. Dies can also be directly bonded to the target substrate even in the presence of other die in situ (e.g., from a previous bonding cycle), hence, enables more than one direct bond cycle to be carried out for a target substrate. As such, multi-color (RGB) display elements can be assembled in stages (e.g., separate bonding cycles), in a flexible manner to provide redundancy or to replace inoperative LED dies.

The LED dies described herein include ILEDs, which refers to inorganic LEDs. A "μLED," or "MicroLED," described herein refers to a particular type of ILED having a small active light emitting area (e.g., less than 2,000 μm$^2$), and in some examples, directionalized light output to increase the brightness level of light emitted from the small active light emitting area. It is advantageous to use direct bonding to assemble small dies, such as μLEDs, onto the target substrate because it is difficult to control the forces adhering and releasing dies at small scales with the use of PUTs.

The "target substrate" described herein refers to a substrate that receives dies via direct bonding. For display devices, the target substrate may include a display substrate, which mechanically secures and provides electrical connections to LED dies.

The "carrier substrate" described refers to a substrate that provides dies to the target substrate via direct bonding. The carrier substrate may be a native substrate where the dies are fabricated, or it may be an intermediate carrier that receives the dies from the native substrate and carries the dies to the target substrate.

Overview of ILED Display Manufacture

ILED display manufacture includes numerous challenges, such as developing assembly techniques/strategies to overcome wafer yield losses. The use of selective Pick Up Tools (PUTs) is one solution to overcoming yield problems where defective die are identified and replaced at source. Another approach is not to replace known defective die and to assemble only Known Good Die (KGD) from the source wafer (or carrier substrate) to a temporary carrier for subsequent picking and placing on the display substrate. This is because replacing defective die is challenging and generally not practical or economical. Both approaches may include performing wafer level testing to determine KGD or defect chips on the wafer, which adds further complexity.

ILED display manufacture refers to the assembly of semiconductor inorganic light emitting diode (ILED) or other μLED dies onto display substrates, which may be flexible substrates such as polymers or rigid substrates such as Thin Film Transistor (TFT) glass substrates. The assembly of millions of small μLEDs chips to create an ILED display can create unique challenges, for example, when considering wafer and assembly yield losses and the test strategy during in-line assembly onto non-native substrates.

For example, conventional techniques may include the use of a PUT that results in various challenges for small die. During flip chip fabrication, for example, the PUT picks up the dies from the carrier substrate by applying an attractive force and holds the die in place until the force is reduced to release the die. Once the die is in contact with the target substrate, the force of attraction to the PUT is removed or reversed. The PUT and the target substrate are separated with a sufficient distance so that the die is not in contact with the PUT and target substrate at the same time and the die is transferred to the target substrate. In some instances, a reverse force may be applied to the PUT before the die has contacted the target substrate and the die is ejected towards the target substrate.

A challenge associated with the use of the PUT is the ability to control the forces adhering and releasing the dies at small scales. In addition, the required forces need to be increased and decreased to enable the pick up and placement of the die. For example, during the pick up stage, the force of attraction between the die and the PUT is greater than that between the die and the carrier substrate. During the placement stage, the force of attraction between the die and the PUT is less than that between the die and the target substrate. Tight control of these forces contributes to a high display yield.

It can also be difficult to scale the forces of a PUT to allow for parallel pick up and placement of a large number of small dies. For example, a vacuum PUT uses air flow, controllers and sensors. Issues associated with the elements of the PUT, such as nozzle clogging, sensor malfunction and inhomogeneity of air flow, are problematic for small dies. Parallel pick up and placement of a large number of small dies using a PUT can be a significant barrier to high yielding assembly.

Alternative techniques for the pick up and placement of small dies, using a PUT, can include the use of conformal heads. In these methods, van der Waals forces can be used to pick up dies using a conformal transfer head and these forces are overcome by lateral movement or varying head-retraction speed of the PUT. However, in essence, such conformal head assembly methods can be seen as a variation of long established flip-chip in that they use PUT collet dies, which generates an adhesion force by van der Waals forces during the pick up stage and this force is switched off or reduced to release the die from the collet onto the substrate.

An alternative method includes the use of PUT based on capacitive forces, which are induced by electrical currents, to adhere the die to the PUT. As part of the die release process, the electrical currents are switched off, which result in a decrease in the adhesion force between the PUT and the die. This allows the die to be released on the target substrate.

The ability to selectively pick up die is a factor for a successful assembly process. Such selectivity may be used as part of a repair cycle, e.g., when a known good die (KGD) of a wafer is available, to avoid the assembly of failed die. Methods which use non individually switchable forces (such as van der Waals) do not enable selective picking up of the die, i.e., PUTs including conformal surfaces cannot selectively pick up a die or other components. The number and location of the die to be assembled is "hard-coded" by a mold used to fabricate the conformal PUT head. In some example methods, MEMS type transducers are incorporated in the conformal heads of the PUTs. The resulting strain on the PUT material may lead to a shorter working lifetime. In addition, the fabrication of such a PUT involves significant complexity and is limited by the maximum density at which the MEMS type transducers can be fabricated. PUTs that use other forces, such as vacuum, could be individually switched in order to achieve selectivity. However, as described above, these forces cannot be effectively scaled to the parallel assembly of large numbers of dies.

Example Direct Bonding Method

Embodiments provide for more efficient and cost-effective techniques to directly bond dies to a substrate, such as μLEDs onto a display substrate. Some embodiments may include a method for temporarily pinning μLED devices onto the non-native substrate where they are grown for transfer directly onto the display substrate, thereby obviating the complications of transferring the μLED to an intermediate carrier substrate or the necessity to use sophisticated pick-up tool (PUT) for pick and place from the intermediate carrier to the display substrate. Furthermore, a bonding process is used to electrically and/or mechanically connect the µLED to the display substrate.

FIG. 1 shows a schematic cross section of a µLED 100, in accordance with one embodiment. The µLED 100 includes, among others, a substrate 102 with a semiconductor epitaxial layer 104 disposed on the substrate 102. The epitaxial layer 104 is shaped into a mesa 106. An active (or light emitting) layer 108 (or "active light emitting area") is included in the structure of the mesa 106. The mesa 106 has a truncated top, on a side opposed to a light transmitting or emitting face 110 of the µLED 100. The mesa 106 also has a near-parabolic shape to form a reflective enclosure for light generated within the µLED 100. The arrows 112 show how light emitted from the active layer 108 is reflected off the internal walls of the mesa 106 toward the light exiting surface 110 at an angle sufficient for the light to escape the µLED device 100 (i.e., within an angle of total internal reflection). The electrical contact pads of the µLED 100 are not shown in FIG. 1, but may be located on a surface of an LED die comprising the µLED device 100 that is opposite to the emitting face 110. An example contact pad has a diameter of about 20 µm.

The parabolic shaped structure of the µLED 100 results in an increase in the extraction efficiency of the µLED 100 into low illumination angles when compared to unshaped or standard LEDs. Standard LED dies generally provide an emission full width half maximum (FWHM) angle of 120°. This is dictated by the Lambertian reflectance from a diffuse surface. In comparison the µLED 100 can be designed to provide controlled emission angle FWHM of less than standard LED dies, such as around 60°. This increased efficiency and collimated output of the µLED 100 can produce light visible to the human eye with only nano-amps of drive current.

The µLED 100 may include an active light emitting area that is less than standard ILEDs, such as less than 2,000 µm². The µLED 100 directionalizes the light output from the active light emitting area and increases the brightness level of the light output. An example of a µLED 100 is shown in FIG. 1. The µLED may be less than 50 µm in diameter with a parabolic structure (or a similar structure) etched directly onto the LED die during the wafer processing steps to form a quasi-collimated light beam emerging from the device.

As used herein, "directionalized light" includes collimated and quasi-collimated light. For example, directionalized light may be light that is emitted from a light generating region of an ILED and at least a portion of the emitted light is directed into a beam having a half angle. This may increase the brightness of the ILED in the direction of the beam of light.

A µLED may include a circular cross section when cut along a horizontal plane as shown in FIG. 1. A µLED may have a parabolic structure etched directly onto the ILED die during the wafer processing steps. The parabolic structure may comprise a light emitting region of the µLED and reflects a portion of the generated light to form the quasi-collimated light beam emerging from the chip.

Process of Direct Transfer of LED Dies onto Target Substrate

Figure 2:
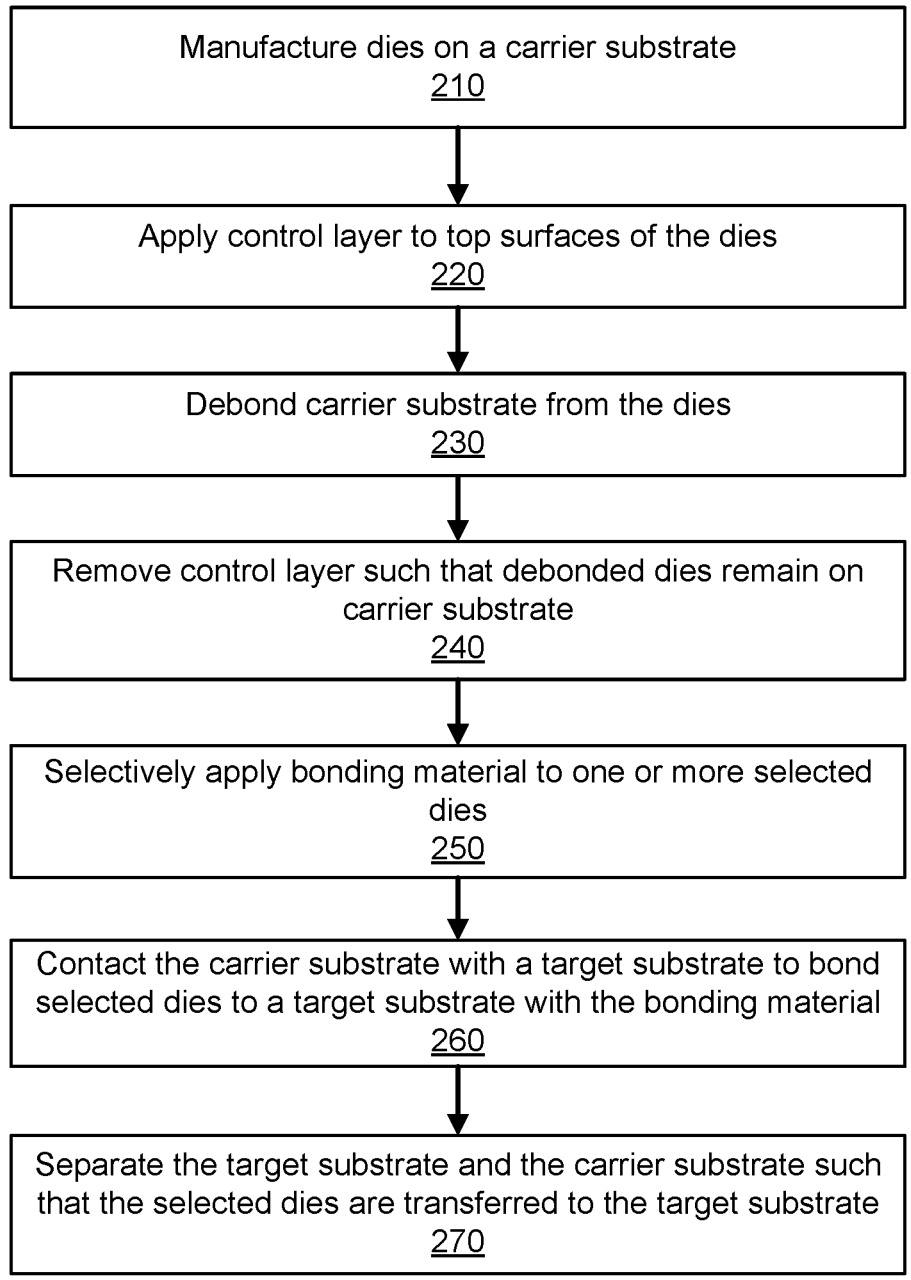
FIG. 2 is a flow chart of a process for providing LED dies on a target substrate, according to one embodiment.
Figure 3A:
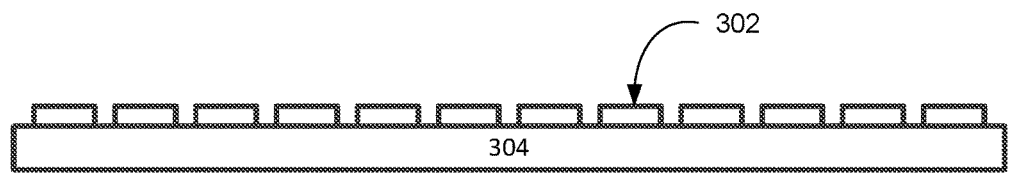
FIGS. 3A through 3F are diagrams illustrating the transfer of LED dies from the carrier substrate to the target substrate, in accordance with one embodiment.

FIG. 2 is a flow chart of a process 200 for providing LED dies on a target substrate, according to one embodiment. Process 200 may be repeated until the dies on the carrier substrate have been transferred to one or more target substrates. Process 200 is discussed for both directionalised and non-directionalised µLED dies, but is applicable to other types of dies. In the following, process 200 is explained with reference to FIGS. 3A through 3F.

µLED dies 302 are manufactured 210 on the carrier substrate 304 as illustrated in FIG. 3A, which may be a native substrate. In the example shown the µLED dies 302 are singulated on the carrier substrate 304 using dry etch techniques. With reference to FIG. 3A, the carrier substrate 304 may be a LED wafer on which the µLED dies 302 are fabricated. For example, the µLED dies 302 may be manufactured by fabricating a plurality of GaN based µLED dies 302, which in this example are fabricated on a sapphire carrier substrate 304. GaN based µLED dies 302 may emit across a range of wavelengths, e.g., from UV to amber. The µLEDs fabricated on the carrier substrate are not limited to GaN based µLEDs fabricated on a sapphire carrier substrate. For example, the µLEDs may be fabricated on a free standing GaN, silicon carbide or silicon substrate instead of the sapphire substrate. In other examples, the µLEDs may include Arsenide or Phosphide based epitaxial layers on a GaAs of GaP substrate.

Figure 3B:
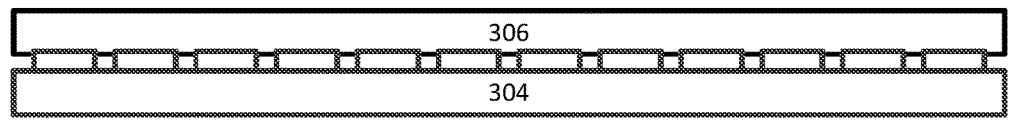

After the µLED dies 302 are fabricated, a control layer 306 is applied 220 to the top surfaces of the µLED dies 302. With reference to FIG. 3B, the control layer 306 is a compliant layer that ensures that the µLED dies 302 remain in position and prevents tilt and rotation during the assembly process. For example, the top surface of each µLED dies 302 may be adhered to the control layer 306. The control layer 306 may retain the plurality of µLED dies 302 in place to ensure that the µLED dies 302 do not move relative to each other during the subsequent carrier substrate removal process.

Figure 3C:
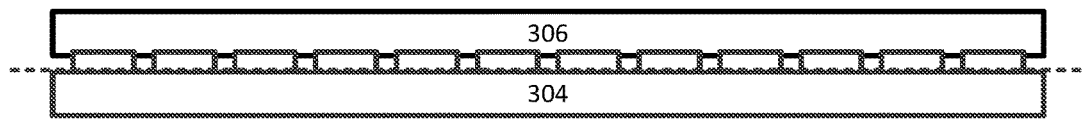

After the control layer 306 is applied, the carrier substrate 304 is debonded 230 from the plurality of µLED dies 302. For example, a laser lift-off (LLO) process may be used for the debonding process. With reference to FIG. 3C, the laser lift-off process debonds the carrier substrate 304 from the plurality of µLED dies 302 using a laser beam, such as a UV laser beam. The laser beam can be directed through the carrier substrate 304 to the µLED dies 302 to melt GaN at the interface between the µLED dies 302 and the carrier substrate 304, thereby decoupling the µLEDs 302 from the carrier substrate 304. In some embodiments, separation of the µLEDs 302 from the carrier substrate 304 may be achieved using other epitaxial release processes. The plurality of µLED dies 302 may remain in contact with the carrier substrate 304 during the lift-off process.

Subsequent to the lift-off process, the control layer 306 is removed 240, and the plurality of debonded µLED dies 302 remain on the carrier substrate 304. In some embodiments, a portion of the control layer 306 may remain on the carrier substrate 304 to minimize movement and dislocation of the die during subsequent steps. In some embodiments, the carrier substrate 304 is the native substrate on which the µLED dies 302 are fabricated, and the same carrier substrate 304 is used for the transfer of the µLED dies 302 to the target substrate 310. In this way, the transfer of the µLED dies 302 to an intermediate carrier layer (e.g., a tape layer) from the native substrate to the target substrate is avoided.

In some embodiments, the µLED dies 302 may be transferred from the native substrate 304 to a further substrate, which forms an intermediate carrier substrate. In some examples, the carrier substrate may be another wafer or substrate material, e.g., UV or thermal release tape.

The carrier substrate 304 may form an inactive or passive bond with the µLED dies 302. One example of a weak bond is that formed by the gallium metal, which binds the µLED dies 302 to the carrier substrate 304. This bond may form an "in-built" adhesive force between the μLED dies 302 and the carrier substrate 304. The adhesion of the μLED dies 302 to the carrier substrate 304 can be modified by heating of the carrier substrate 304. This causes the gallium metal to melt, thereby reducing the bond force between the μLED dies 302 and the carrier substrate 304. In other examples one or more tapes, such as one or more UV or thermal tapes (not shown) can be used to maintain the μLED dies 302 on the carrier substrate 304. Such tapes may also provide an adhesive force between the μLED dies 302 and the carrier substrate 304. It is noted that the adhesive force does not require an adhesive material, and that adhesion may occur due to many factors and does not require an "adhesive" or glue. It is also noted that the adhesive force applied between μLED dies 302 and the carrier substrate 304 may be substantially zero. Another example of a weak force could be a van der Waals bond between the die of the μLED dies 302 and the carrier substrate 304.

Figure 3D:
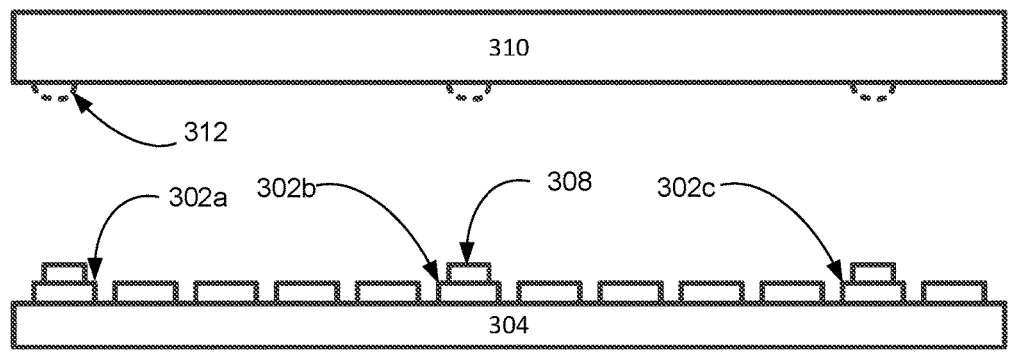

A bonding material 308 is selectively applied 250 to one or more selected μLED dies 302. With reference to FIG. 3D, the bonding material 308 is applied to a set or array of selected μLED dies 302a, 302b, and 302c. The bonding material 308 provides an adhesive force between the set of selected μLED dies 302a through 302c and a target substrate 310 when the target substrate 310 is brought into contact with the bonding material 308.

The bonding material 308 may be electrically conducting and provide for an electrical interconnection between the μLED dies 302a through 302c and the target substrate 310. Specifically, the bonding material 308 may provide for an electrical connection between electrical contacts of the μLED dies 302a through 302c and electrical contacts on the target substrate 310. In other examples, the bonding material 308 may be insulating and may be configured to provide a mechanical bond of the μLED dies 302a through 302c to the target substrate 310.

The application of the bonding material 308 on the μLED dies 302a through 302c can be achieved by various techniques. In some embodiments, the bonding material 308 may be selectively applied to the target substrate 310 (e.g., rather than on the selected μLED dies 302a through 302c). For example, the bonding material 308 may be applied to selected die transfer locations 312 that spatially correspond with locations of the selected μLED dies 302a through 302c when the target substrate 310 and the carrier substrate 304 are brought into contact. In some embodiments the bonding material 308 may be applied to both the selected μLED dies 302a and the target substrate 310.

The set of selected μLED dies 302a through 302c may be fabricated or otherwise disposed on the carrier substrate 304 in positions corresponding to the positions of pixels of a display element on the target substrate 310 when the target substrate 310 is a display substrate. The set of μLED dies 302a through 302c may be in a predetermined pattern or array (e.g., every tenth μLED 302 is selected with the bonding material 308 in the current bonding cycle) and may comprise adjacent μLEDs, or μLEDs that are separated by other μLEDs (and/or spaces on the carrier substrate 304 where μLEDs were separated in a prior bonding cycle). The set of μLEDs to be placed may be determined by electrical tests which have been carried out to determine KGD or failed die on the carrier substrate. For example, the selected μLEDs may include KGD and failed die may be excluded from the selected μLEDs. The μLEDs excluded from the selected μLEDs in a bonding cycle are referred to herein as non-selected μLEDs dies.

Figure 3E:
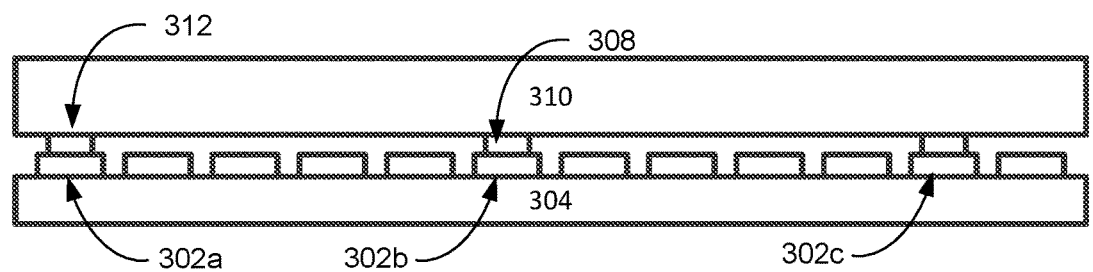
Figure 3F:
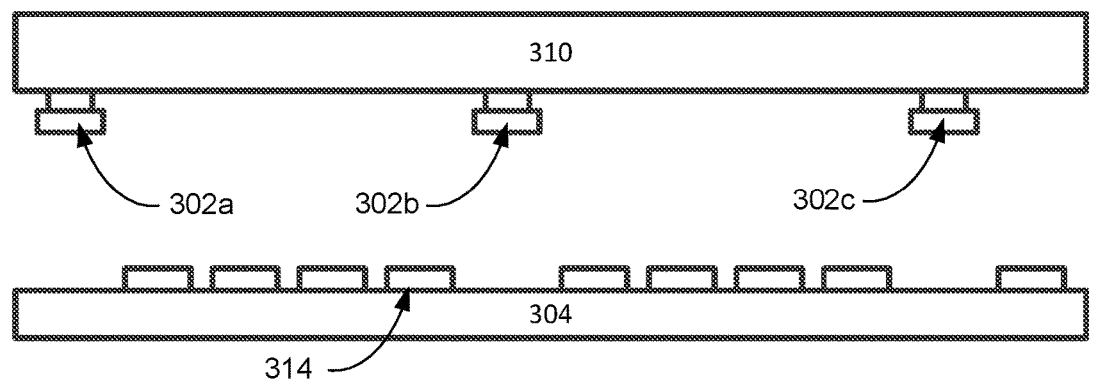

The target substrate 310 and the carrier substrate 304 are brought into contact 260 such that the bonding material 308 is between the selected μLED dies 302a through 302c and the selected die transfer locations on the target substrate 310. With reference to FIG. 3E, the target substrate 310 may be moved towards the carrier substrate 304 to contact the bonding material 308 applied to the set of selected μLED dies 302a through 302c. The carrier substrate 304 and the target substrate 310 may be brought into contact such that the bonding material 308 is between the selected μLED dies 302a through 302c on the carrier substrate 304 and the selected die transfer locations 312 on the target substrate 310.

While the carrier substrate 304 is in contact with the bonding material 308, an adhesive force between the set of selected μLED dies 302a through 302c and the target substrate 310 is greater than the adhesive force between the set of μLED dies 302a through 302c and the carrier substrate 304. In some embodiments, the adhesive force between the set of μLED dies 302a through 302c and the target substrate 310 can modified, such that the adhesive force between the selected μLED dies 302a through 302c and the target substrate 310 is greater than the adhesive force between the selected μLED dies 302a through 302c and the carrier substrate 304. This modification may include curing the selectively applied bonding material 308 by irradiating the set of selected μLED dies 302a through 302c and/or corresponding portions of the carrier substrate 304 with UV light. In other examples, heat may be applied to the set of selected μLED dies 302a through 302c and/or the corresponding portions of the target substrate 310 to bond the selected μLED dies 302a through 302c to the target substrate 310. The set of selected μLED dies 302a through 302c on the target substrate 310 may form a matrix of μLEDs corresponding to pixel locations in a display panel.

After the selected μLED dies 302a through 302c are bonded to the target substrate 310, the carrier substrate 304 is separated 270 from the target substrate 310, and the selected μLED dies 302a through 302c are coupled to the target substrate 310. The non-selected μLED dies 314 remain on the carrier substrate 304, such as for transfer of selected ones of the μLED dies 314 to the target substrate (or a different target substrate) in a subsequent bonding cycle.

Process of Transfer of LED Dies Via Intermediate Carrier Substrate

Figure 4:
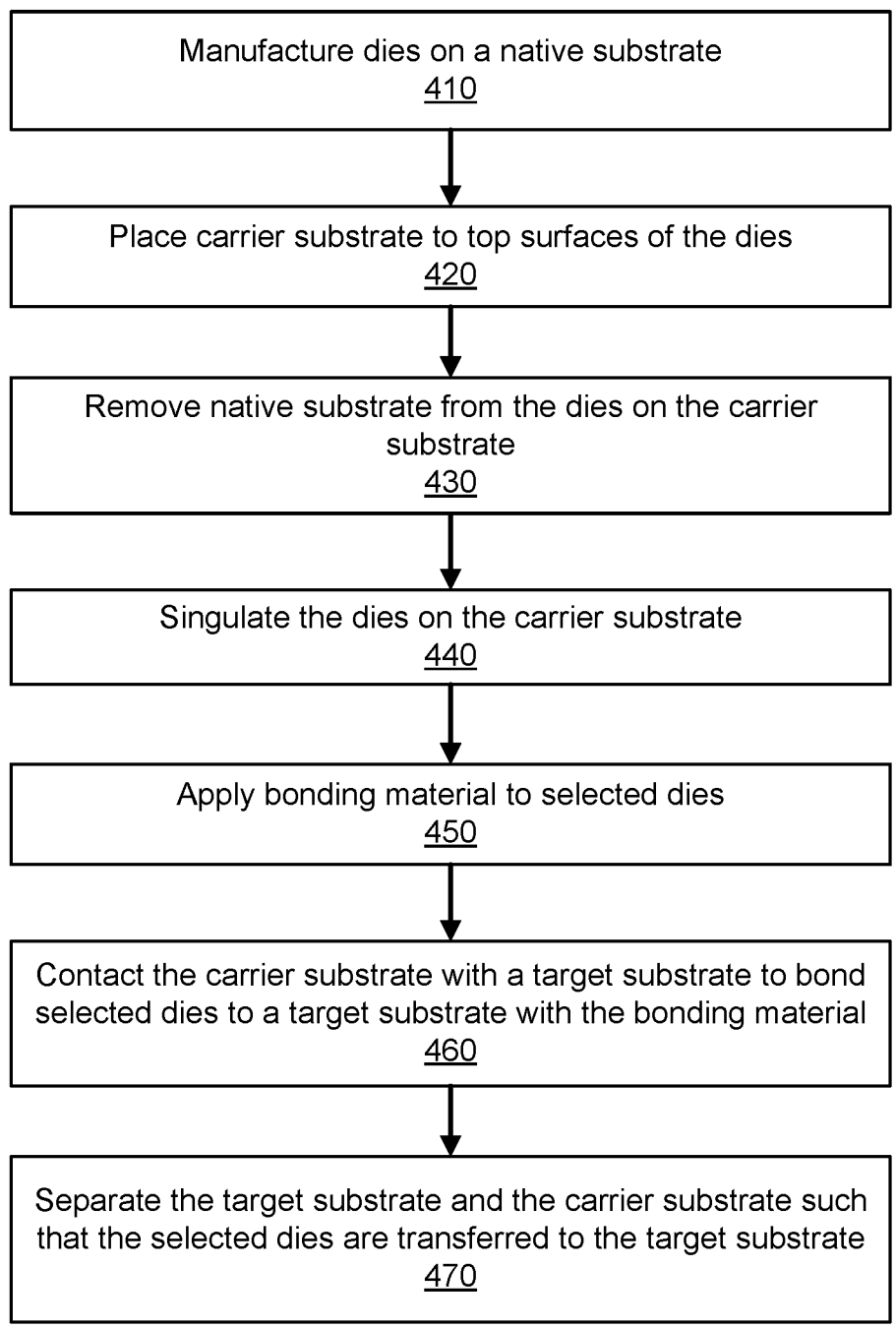
FIG. 4 is a flow chart of a process for transferring LED dies from an intermediate carrier substrate to a target substrate, in accordance with one embodiment.
Figure 5A:
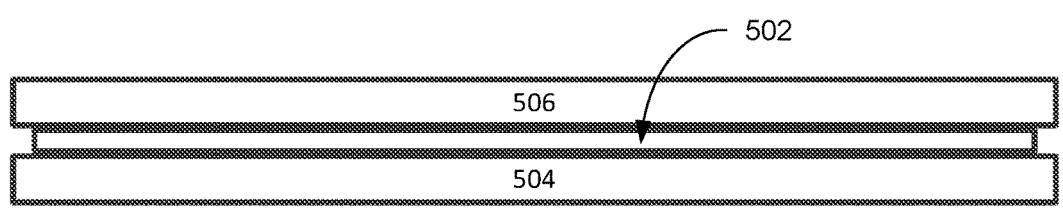
FIGS. 5A through 5E are diagrams illustrating the transfer of LED dies from the intermediate carrier substrate to the target substrate, in accordance with one embodiment.

FIG. 4 is a flow chart of a process 400 for providing LED dies to a target substrate using an intermediate carrier substrate, according to one embodiment. Process 400 is an example of a bonding cycle that transfers a selected portion of dies from an intermediate carrier substrate (or "sticky handle") to a target substrate, rather than using the native substrate as the carrier substrate as discussed above with reference to FIG. 2. Process 400 is discussed with reference to the diagrams shown in FIGS. 5A through 5E. Process 400 is discussed for μLED dies, but is applicable to other types of dies.

μLEDs 502 are manufactured 410 on a native substrate 504 (e.g., a wafer). After the μLED 502 are fabricated, the carrier substrate 506 is placed 420 on to the top surfaces of the μLEDs 502. With reference to FIG. 5A, the carrier substrate 506 is an intermediate carrier substrate that is separate from the native substrate 504, and is used to perform the transfer of selected μLEDs 502 to a target substrate. The carrier substrate 506 may include a tape, such as a UV or thermal tape, which attaches the top surfaces of the μLEDs 502 to the carrier substrate 506.

Figure 5B:
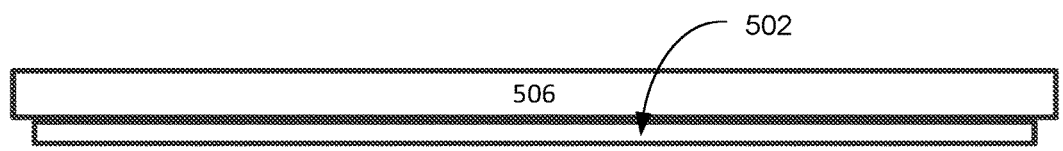

The native substrate 504 is removed 430 from the plurality of μLEDs 502 attached to the carrier substrate 506. The removal may be performed using a laser lift-off (LLO) process, as described above with reference to FIG. 2. As shown in FIG. 5B, after removal native substrate 504, the μLEDs 502 are attached to the carrier substrate 506.

The μLED dies 502 are singulated 440. For example by using a combination of photolithography to define a hard mask and dry etch methods (e.g., deep reactive-ion etching (DRIE) or inductively coupled plasma (ICP) etching). In some embodiments, the μLEDs may be singulated prior to the application of the carrier substrate 506 (e.g., as discussed above in process 300). Additional methods of die singulation include, but are not limited to, saw dicing and laser dicing.

Figure 5C:
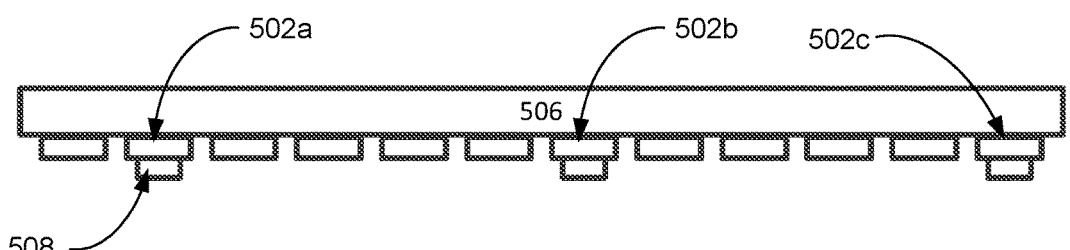

A bonding material 508 is applied 459 to selected μLED dies 502a through 502c. With reference to FIG. 5c, the bonding material 508 is applied to a set of singulated μLED dies 502a through 502c. In some embodiments, the bonding material may be applied using Laser Induced Forward Transfer (LIFT).

Figure 5D:
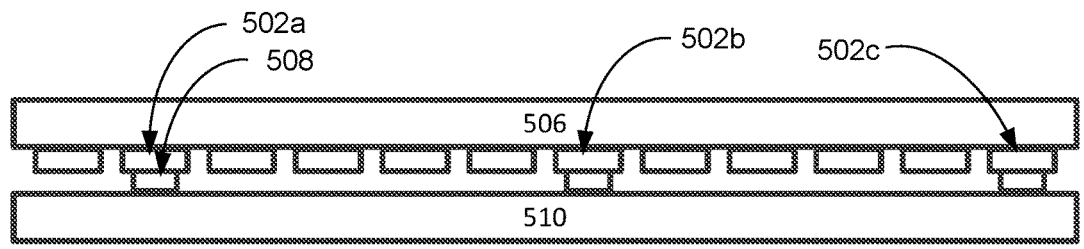

The carrier substrate 506 and the target substrate 510 are brought together so that the target substrate 510 contacts 460 the bonding material 508 applied to the set of selected μLED dies 502a through 502c. As shown in FIG. 5D, the bonding material 508 causes adhesion of the set of selected μLED dies 502a through 502c to the target substrate 510. When the dies are μLEDs, the target substrate 510 is a display substrate. While the target substrate 510 is in contact with the selected μLED dies 502a through 502c and, for example, and after the bonding material 508 is cured, a level of adhesion between the set of selected μLED dies 502a through 502c and the target substrate 510 is greater than that between the level of adhesion between the set of selected μLED dies 502a through 502c and the carrier substrate 506. The level of adhesion between the selected μLED dies 502a through 502c and the target substrate 510 can be modified such that the set of selected μLED dies 502a through 502c adhere to the target substrate 510.

Additionally or alternatively, an adhesive force between the set of selected μLED dies 502a through 502c and the carrier substrate 506 can be modified such that the adhesive force is less than that between the set of μLED dies 502a through 502c and the target substrate 510. In some embodiments, the carrier substrate 506 may include a tape (not shown), which adheres the μLED dies 502 to the carrier substrate 506. The tape may provide active adhesion strength on the μLED dies 502, which may be reduced by a stimulus. For example, the tape may be a UV tape and a reduction of the level of adhesion between the set of μLEDs dies 502a through 502c and the tape can be achieved by irradiating the set of μLED dies 502a through 502c and/or corresponding portions on the carrier substrate 506 with UV light. This may be done selectively such that only the adhesive force of the set of selected μLED dies 502a through 502c is changed. In other examples, the tape may be a thermal tape and a reduction of the level of adhesion between the selected μLED dies 502a through 502c and the carrier substrate 506 may be achieved by applying heat to the set of selected μLED dies 502a through 502c and/or corresponding portions on the carrier substrate 506.

Figure 5E:
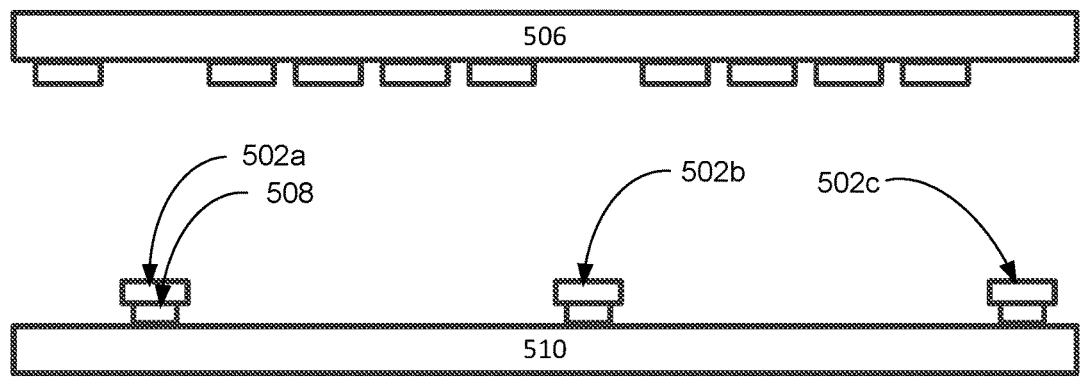

The carrier substrate 506 is separated 470 from the target substrate 510. As shown in FIG. 5E, the separation results in the selected μLED dies 502a through 502c being left on the target substrate 510 because of the adhesion strength between the target substrate 510 and the selected μLED dies 502a through 502c being greater than the adhesion strength between the carrier substrate 506 and the selected μLED dies 502a through 502c.

In some embodiments, one or more of the electrical contacts for each μLED die may be electrically connected to corresponding contacts on the target substrate during the direct bonding step. The bonding material may form interconnection or bonding elements, which allow the μLEDs to be bonded to the target substrate.

In some embodiments, only some μLEDs of the native substrate 504 are transferred to the carrier substrate 506 (e.g., instead of all μLED dies 502 fabricated on the native substrate 504). For example, 1×1 cm cells of μLED dies 502 of the native substrate 504 may be transferred to the carrier substrate 506. Such a cell may contain 1,000,000 ILEDs, each of 10×10 μm size. Benefits of such a method include the ability to form carrier substrates 506 with selected μLEDs fabricated on different native substrates 504. Furthermore, the selected μLEDs from across the different native substrates 504 can be fabricated in substantially the same locations on the native substrates 504. Put another way, a carrier substrate 506 and native substrate 504 may line up differently in different bonding cycles to selectively transfer dies from native substrates to selected locations on the carrier substrate 506.

Direct Bonding Material Application

As the performance of LED dies may vary based on their fabrication location on the native substrate 504, selection of high performance μLEDs across multiple native substrates 504 may result in a carrier substrate 506 with greater LED performance homogeneity and reliability than the (e.g., average) μLED fabricated on the native substrate 504. Another benefit of transferring only some μLEDs of the native substrate 504 to the carrier substrate 506 in a bonding cycle is the ability to more efficiently use the round edge portions of the circular native substrate wafers. The μLEDs fabricated at the edge portions of a circular native substrate 504 may be transferred to carrier substrates 506 in portions, a sequence, or otherwise selectively to fit on an approximately triangular, square, or parallelogram carrier substrate 506. Carrier substrates 506 with long straight edges provide benefits when assembling their μLEDs to target substrates 510.

The bonding material 508 may be applied using, for example, electroplating, electroless plating techniques, screen printing, inkjet deposition, lithography, evaporation, laser based deposition techniques, self-assembly and transfer-printing. In some embodiments, a (e.g., conductive) bonding material may be deposited on the μLEDs. In some embodiments, the bonding material 508 is applied to the selected μLEDs in parallel or concurrently, rather than using a serial μLED-by-μLED application of the bonding material.

Inkjet and screen printing provide for the deposition of bonding materials—Lithography and evaporation technique may also be used in the formation of metal interconnects. Self-assembly and transfer printing techniques may also be used to prepare contact materials—particularly metals. Additionally or alternatively, electroplating and solder deposition may be used to deposit the bonding material 508.

An example bonding material 508 includes Anisotropic Conducting Films (ACF). Another example bonding material may be solder or nanosolder materials that may use solder based reflow techniques. Solder or nanosolder materials may be applied to the μLEDs and/or on the display substrate. Another example process for applying the bonding material on the μLEDs and/or the display substrate includes electroplating of interconnects. This process may allow a large number of interconnecting elements to be deposited on the μLEDs and/or the display substrate.

Another example process for applying the bonding material on the μLEDs and/or the display substrate includes a self-assembly based technique. This may allow high resolution and a high deposition speed of a range of interconnection materials. Gold nanoparticles may be self-assembled on substrates such as glass using techniques including DNA and polymer mediation (see e.g., Polymer and biopolymer mediated self-assembly of gold nanoparticles, Ofir et al, Chem. Soc. Rev., 2008, 37, 1814-1825) and the confinement of collidial suspensions to microcavities (see e.g., Hierarchical Self-Assembly of Gold Nanoparticles into Patterned Plasmonic Nanostructures, Hamon et al., ACS Nano, 2014, 8 (10), pp 10694-10703). The DNA or polymer mediators are selectively applied to the target substrate using patterning techniques. The gold particles are then washed over the target substrate. The DNA or polymer mediators selectively bond the nanoparticles which results in the pattern being replicated in metal nanoparticles. The nanoparticulate solder material is capable of providing strong mechanical and electrical bonds between the LED device and the display substrate.

Another example process for applying the bonding material on the μLEDs and/or the target substrate (e.g., TFT layer) includes Laser Induced Forward Transfer (LIFT). LIFT is a method whereby a micro-pattern can be rapidly generated in a range of materials and on a range of substrates. A film containing the bonding material to be deposited is created on a partially transparent target substrate. The partially transparent target substrate is brought in close contact with the dies (e.g. μLEDs) on the carrier substrate. A laser or other irradiation source is used to illuminate the transparent target substrate. This illumination source causes the bonding material to be ejected from the partially transparent target substrate and onto the dies. By control of the illumination area, power and pattern, the bonding material may be selectively applied to one or more of the dies.

In some embodiments, adhering the μLEDs to the target substrate includes the use of underfills or B-stageable no-flow underfills (BNUF), such as B-stage epoxy. B-stage epoxies may be conductive or insulating. B-stage epoxy is a descriptive term for an epoxy system that can be partially cured or "pre-dried" as an initial stage after being applied to a substrate or surface. At a later stage it can be cured to a solid state, e.g. by irradiation with UV light, application of heat and/or pressure. The viscosity of the B-stage epoxy changes as a function of temperature.

The underfill is deposited on the target substrate and/or the μLEDs at low temperature (typically <100° C.) and the μLEDs can then be placed on the target substrate. At an elevated temperature, typically 100-200° C. the viscosity of the B-stage epoxy is low to allow excess material to be squeezed out from the interface between the μLED and target substrate and flow. This may enable the metal to metal contact to occur between the contact pads of the μLEDs and the contact elements of the target substrate.

After all the μLEDs have been removed from the carrier substrate and are on the target substrate, the μLEDs may be permanently bonded to the target substrate. This may be achieved by heating or UV light irradiation of the underfill. For example, at a higher temperature, typically 200-300° C., the μLED can be permanently bonded to the display substrate. An advantage of B-stage epoxy is that it can avoid manufacturing bottle-necks and increases production as final bonding does not have to immediately follow the application of the epoxy adhesive.

The B-stage epoxy can assist in the adhesion between the μLED and the target substrate, thereby facilitating the release of the μLED from the carrier substrate after placement.

The techniques discussed above may be suitable for the creation of fine bonding elements or interconnection elements. These interconnection elements or bonding elements may be used to bond and/or electrically connect the μLEDs to the target substrate.

The example processes shown in FIGS. 2 and 4 may be used to bond μLEDs on a non-populated TFT layer (that forms the target substrate) to form a pixel. A plurality of μLEDs may be bonded on the TFT layer so that each pixel of the display has at least one μLED of one of color (e.g., red, green or blue). Once all pixels of the display include at least one μLED of one color, the process can be repeated for the two remaining colors. In some embodiments, different color LED dies (e.g., RGB) are added to the target substrate sequentially, and in different bonding cycles. The different color LED dies may use separate carrier substrates such that a different carrier substrate is used in each bonding cycle. In some embodiments, the LED dies on the carrier substrate may be more arranged more densely than when the LED dies are transferred to the target substrate. Here, the LED dies may be transferred to a non-populated or otherwise spatially compatible surfaces (e.g., of other target substrates) in one or more bonding cycles to create a sufficiently sized space to avoid blocking of LED dies to be transferred to the surface of the target substrate by in situ LED dies already bonded to the surface of the target substrate.

Alternatively or additionally, the example process shown in FIGS. 2 and 4 may be repeated to bond a plurality of μLEDs of each color at each pixel location. This may lead to an increased yield of the display.

Alternatively or additionally, processes 200 and 400 may be used in a case where a defective μLED has been observed during testing of the μLED on a target substrate. The example processes may be repeated to place a new μLED at a pixel location of a defective μLED (e.g., a μLED that does not contain a functional emitter or has a parametric defect detected from the diode characteristics). The new μLED may be replace the defective μLED, which has been removed from the target substrate, or may be placed at the same pixel location as the defective μLED, which remains on the target substrate but has been disconnected from the electrical connections in the TFT layer, for example using laser trimming.

Multiple bonding cycles may be used to assemble a display panel that includes yielding display pixels (e.g., almost 100% pixel yield). LED dies may be placed on a target substrate until all display pixels are working. This may include placing an LED die of a particular color within a sub-pixel of a pixel when an in-situ LED die of that color within the sub-pixel is defective. Multiples of such replacement LED dies may be placed in a single bonding cycle, such as to place a replacement LED die within each sub-pixel having only a defective in-situ die (or multiple defective in-situ dies). After a bonding cycle that places the LED dies, the LED dies may be tested and the remaining defective dies and their corresponding sub-pixel is identified. If any defective die remain, another bonding cycle can be used to transfer LED dies into the sub-pixels including defective die(s). This process can be repeated for multiple bonding cycles until a target yield (e.g., 100%) of the fully functional pixels has been achieved. A pixel may be considered fully functional when each sub-pixel of the pixel has at least one functioning LED die.

Transfer of Die from Carrier Substrate to Target Substrate with In Situ μLEDs

After the first bonding cycle is complete the target substrate will have some number of die in situ (e.g. blue dies). In order to produce a multicolor display, dies of another color must now be placed on the substrate (e.g. red dies). Assuming the carrier substrate which contains the red dies has not been used in a previous bonding cycle, the carrier substrate will be fully populated. Therefore any attempt to make contact between the dies on the red carrier wafer and the target substrate will be interfered with and blocked by the in situ die. This will results in the failure of the bonding process.

In order to overcome the blocking by the in situ dies, the red carrier substrate must undergo at least one prior bonding process before it can be used on a target substrate with dies in situ. This prior bonding process must occur on a target substrate with no die in situ. This prior bonding process creates gaps in the carrier substrate which can then be aligned with the in situ dies of the next target substrate. Additionally, assuming all dies are the same size, a target substrate with two dies in situ can only be bonded to by a carrier substrate that has undergone at least two prior bonding processes.

Figure 6:
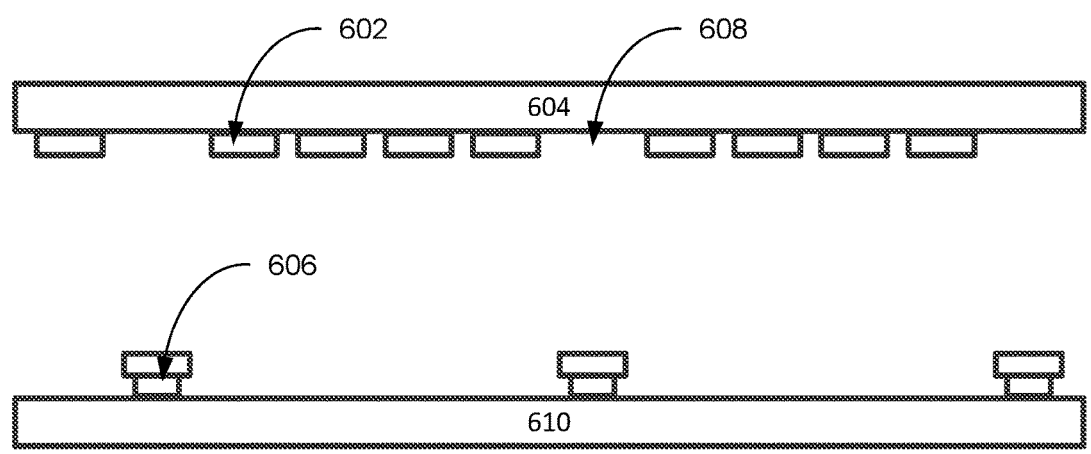
FIG. 6 is a diagram illustrating an alignment between a carrier substrate and a populated target substrate, in accordance with one embodiment.

FIG. 6 is a schematic representation of an alignment between a carrier substrate and a populated target substrate, in accordance with some embodiments. As shown, at least some of the μLEDs located on the carrier substrate 604 have been placed on another target substrate (e.g., in a previous bonding cycle, not shown in FIG. 6), leaving μLEDs 602 remaining on the carrier substrate 604. This leads to one or more gaps or spaces 608 on the carrier substrate 604, i.e., locations on the carrier substrate 604, which do not include a μLED 602. To enable at least one of the μLEDs 602 remaining on the carrier substrate 604 to be contacted by a target substrate 610 (e.g., in a subsequent bonding cycle), which already has in situ μLEDs 606 bonded thereto (e.g., from a previous bonding cycle with another carrier substrate (not shown in FIG. 6) where the μLEDs 606 were selected μLEDs), the target substrate 610 is aligned relative to the remaining μLEDs 602 on the carrier substrate 604. This alignment may prevent spatial interference between the previously placed in situ μLEDs 606 on the target substrate 610 and the remaining μLEDs 602 located on the carrier substrate 604.

In some embodiments, the carrier substrate 604 may be aligned relative to the target substrate 610 to enable at least one of the μLEDs 602 on the carrier substrate to be contacted by the target substrate 610. As shown in FIG. 6, the gaps or spaces 608 on the carrier substrate 604 correspond to locations of previously placed, in situ μLEDs 606 on the target substrate 610 to prevent interference. Interference can make the placement of μLEDs 602 on the populated target substrate 610 including one or more in situ μLEDs 606 challenging because of the (e.g., sub-micron) tolerance in the alignment between the target substrate 610 and the carrier substrate 604. In addition, movement of the μLED die on the target substrate 610 or carrier substrate 604 (e.g., during a previous bonding cycle) may make alignment difficult. In another example, the structure of the target substrate 610 may warp or bow, making the alignment difficult.

In some embodiments, the size of gaps 608 on the carrier substrate 604 may be increased by bonding μLEDs located on the carrier substrate 604 to one or more other (e.g., non-populated) target substrates before bonding the remaining μLED dies of the carrier substrate 604 to the populated target substrate 610 including one or more previously placed in situ μLED dies 606.

It should be noted that the reference to different target substrates does not necessitate that the target substrates are on mechanically separate pieces. For example, a TFT Gen 10 glass plate may contain more than 100 displays which are processes in parallel. One or more of these displays may be considered individual target substrates.

Figure 7:
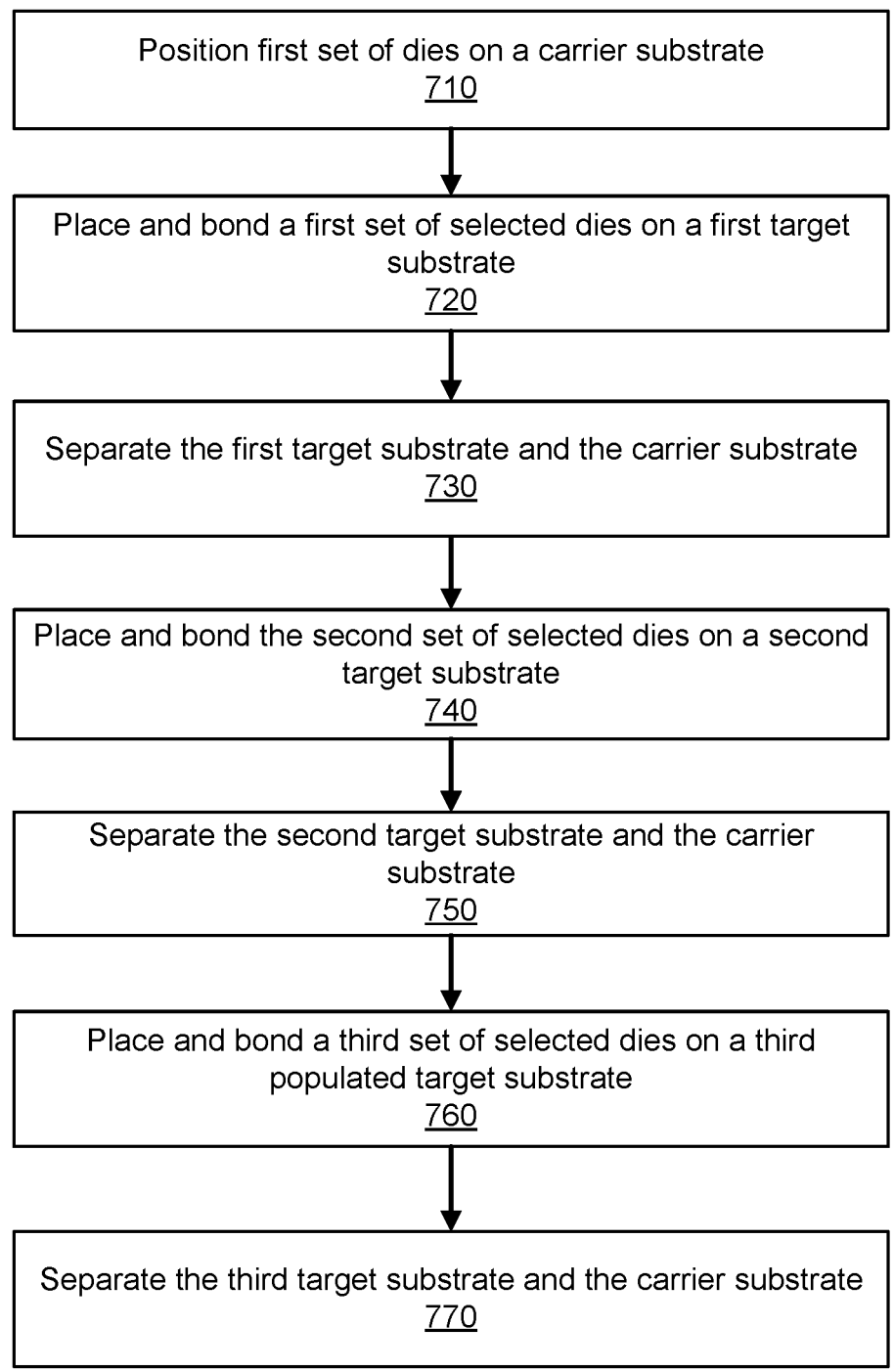
FIG. 7 is a flow chart of a process for transferring LED dies from a carrier substrate to a populated target substrate, in accordance with one embodiment.
Figure 8A:
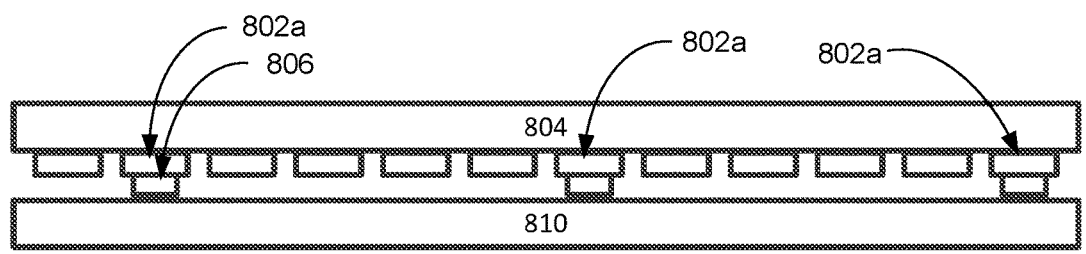
FIGS. 8A through 8G are diagrams illustrating the transfer of LED dies from the carrier substrate to the populated target substrate, in accordance with one embodiment.

FIG. 7 is a flow chart of a process 700 for transferring LED dies from a carrier substrate to a populated target substrate, in accordance with one embodiment. A first set of μLEDs 802 is processed and positioned 710 on a carrier substrate 804. With reference to FIG. 8A, the carrier substrate 804 may be provided in the form of a sticky handle or handle layer (i.e., a carrier substrate that includes a tape or handle layer for adhering the μLEDs 802 to the carrier substrate 804). In some embodiments, the carrier substrate 804 is an intermediate substrate and the μLEDs 802 are fabricated on a separate native substrate.

A first set of selected μLEDs 802a from the μLEDs 802 is placed 720 on the first target substrate 810 by application of a bonding material 806. The first target substrate 810 is initially a non-populated target substrate. The first set of μLEDs 802a is a subset of the μLEDs 802 on the carrier substrate 804.

Figure 8B:
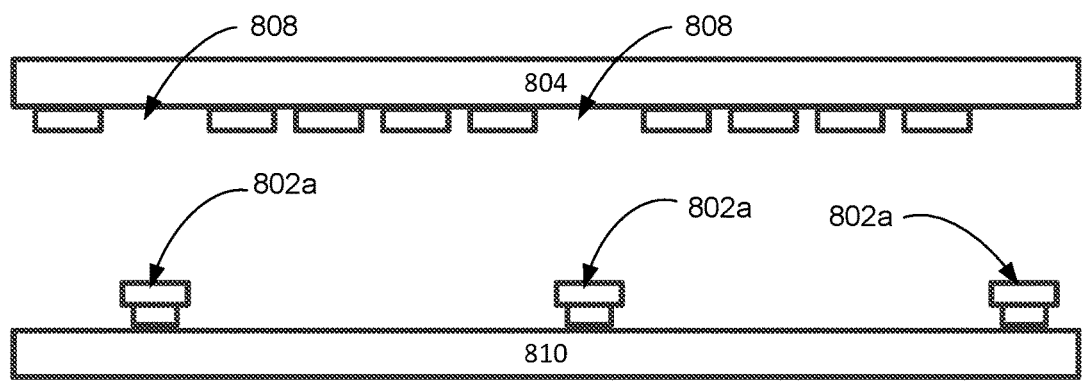

The first target substrate 810 and the carrier substrate 804 are separated 730. With reference to FIG. 8B, the first set of selected μLEDs 802a remain on the target substrate 810, which then can be considered as a populated target substrate 810. The placement of the first set of selected μLEDs 802a on the first target substrate 810 results in the formation of one or more gaps or spaces 808 between the remaining μLEDs 802 on the carrier substrate 804. Steps 720 and 730 represent a first bonding cycle. A second bonding cycle is performed 740, 750.

Figure 8C:
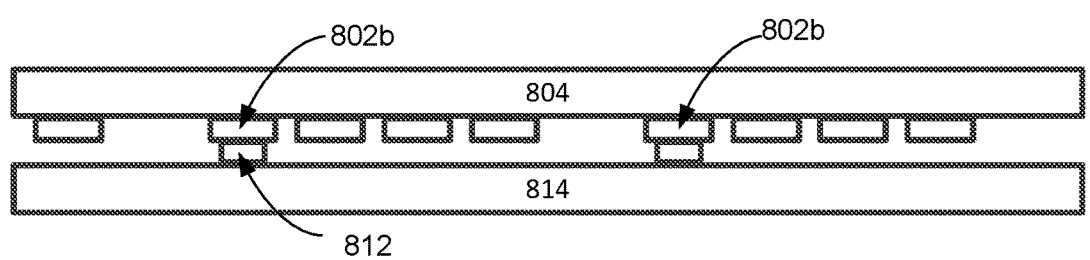

A second set of selected μLEDs 802b is positioned on and bonded 740 to a second target substrate 814. The second set of selected 802 may be a subset of the remaining μLEDs 802 on the carrier substrate 804. The second target substrate 814 may be a non-populated target substrate that is different from the now partially populated first target substrate 810. With reference to FIG. 8C, the second set of selected μLEDs 802b contacts the second target substrate 814 via the bonding material 812. The bonding material 812 is applied to a second set of selected μLEDs 802b from remaining μLEDs 802 positioned on the carrier substrate 804.

Figure 8D:
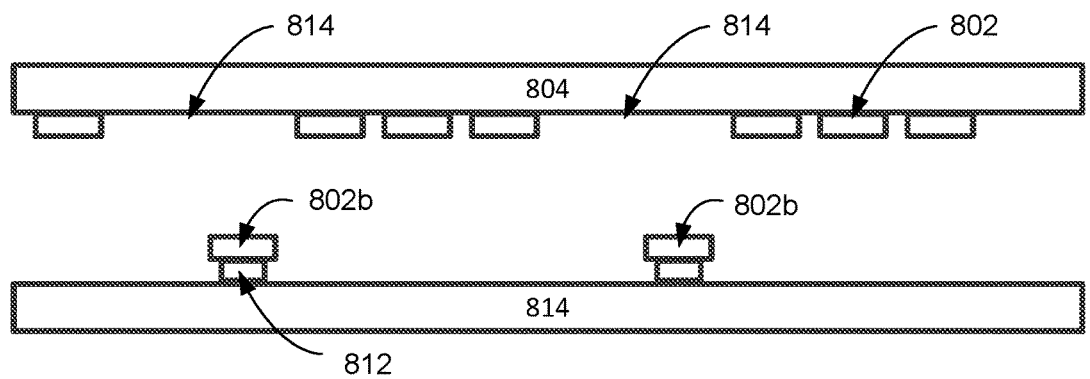

At 750, the second target substrate 814 and the carrier substrate 804 are separated. With reference to FIG. 8D, using the carrier substrate 804 for bonding of the second set of μLEDs 802b on the second target substrate 814, the size of the gaps or spaces 814 between the remaining μLEDs 802 on the carrier substrate 804 is increased (e.g., relative to the size of the gaps 808 created in the first bonding cycle at step 730). The increased gaps or spaces 814 on the carrier substrate 804 facilitate the alignment of the carrier substrate 804 with a populated target substrate as discussed above, e.g. to bond one or more additional μLEDs for the remaining colors of the display, repair and replace a defective μLED or place an additional μLED at the pixel location of a defective μLED.

Figure 8E:
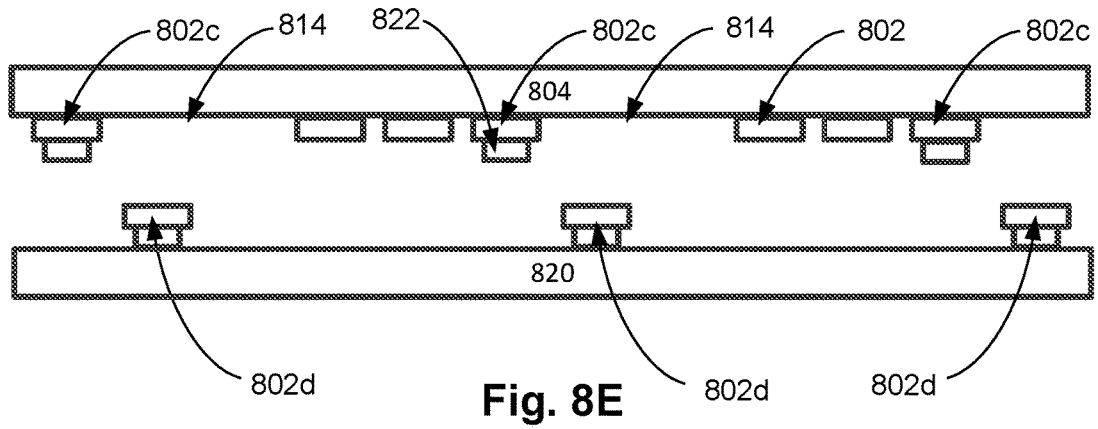

A third bonding cycle is performed 760, 770. A third set of selected μLEDs 802c on the carrier substrate 804 is placed and bonded with 760 a populated third target substrate 820. With reference to FIG. 8E, the third target 820 is populated and includes in situ μLEDs 802d. In some embodiments, the third target substrate 820 is the first target substrate 810, and the in situ μLEDs 802d bonded to the third target substrate 820 are the first set of selected μLEDs 802a. In other examples, the μLEDs 802d on the populated third target substrate 820 may correspond with the second set of selected μLEDs 802b. Here, the third target substrate 820 is the same as the second target substrate 814. In another example, the third target substrate 820 may be different from the first and second target substrates 810 and 814, such as a target substrate that received the in situ μLEDs 802d from a second carrier substrate different from the carrier substrate 804. In some embodiments, the μLEDs adhered to a target substrate in different bonding cycles (and/or from different carrier substrates) may include different types of μLED dies (e.g., μLED dies that emit at a different wavelength, μLED dies comprising a plurality of LED emitters, LED dies of different physical properties such as output wavelength, etc.).

Figure 8F:
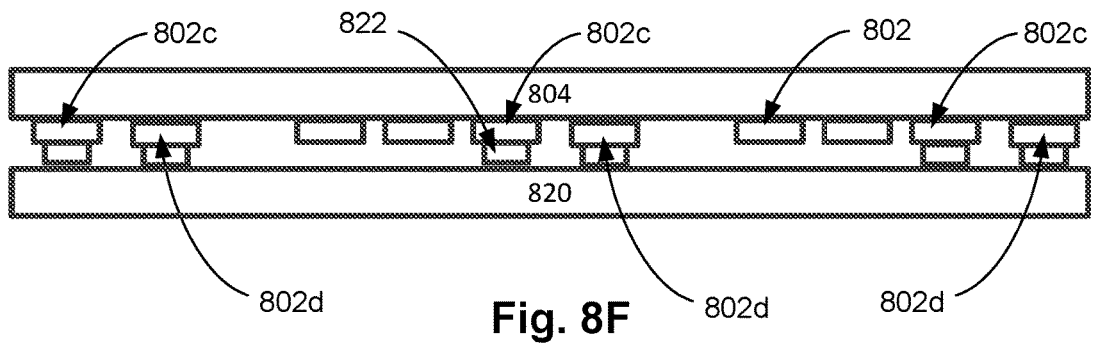

Prior to the carrier substrate 804 being brought together with the third target substrate 820, the remaining μLEDs 802 on the carrier substrate 804 are aligned relative to the in situ μLEDs 802d to enable the populated third target substrate 820 to contact the third set of selected μLEDs 802c and placement of the third set of selected μLEDs 802c on the populated third target substrate 820. The third set of selected μLEDs 802c are then adhered to the populated third target substrate 820 using the bonding material 822, as shown in FIG. 8F.

Figure 8G:
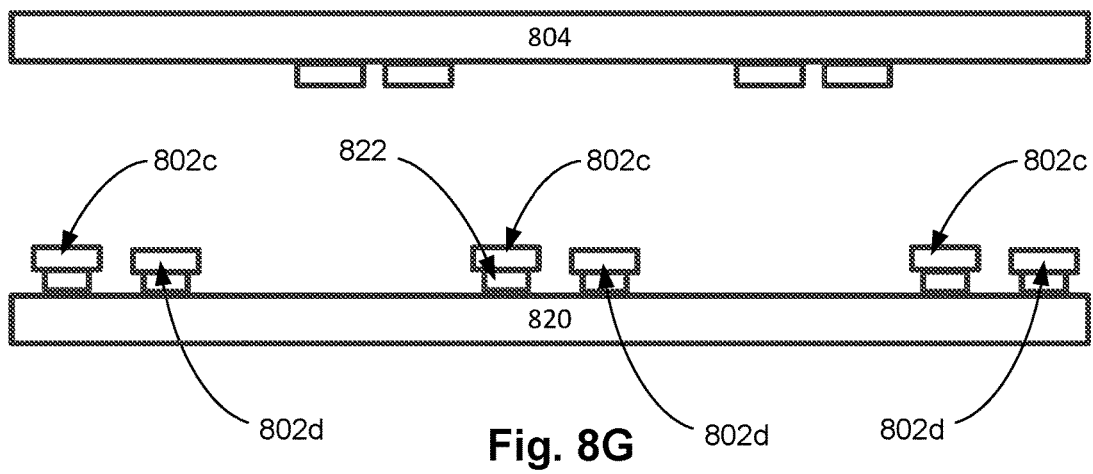

The third target substrate 820 and the carrier substrate 804 are separated 770. With reference to FIG. 8G, the third selected μLEDs 802c are now adhered to the third target substrate 820 with the in situ μLEDs 802d selected from a previous bonding cycle of the third target substrate 820. The μLEDs 802c and μLEDs 802d bonded to the third target substrate 820 may include different color LEDs. The in situ μLEDs 802d are transferred from a different carrier substrate than the carrier substrate 804, where each carrier substrate includes different color LEDs.

It is noted that process 700 is not limited to the placement of one die per display sub-pixel or three dies for a pixel. For example, a pixel may include multiple dies for each sub-pixel to offset occurrences of die failure. Multiple color LED dies of the same color/type within a sub-pixel may be placed on the target substrate in the same placement cycle. A LED die may fail because of flaws in the die fabrication process, the assembly process, the electrical connection process (if done separately from the assembly). In another example, an LED die may fail after a period of use. Placing multiple LED dies within the same sub-pixel provides redundancy and thus a lower likelihood of total failure (e.g., no light emission from any die) of the sub-pixel.

In the above examples, the bonding material was applied to μLEDs. In other examples, the bonding material may be applied to the target substrate, for example at locations corresponding to pixels of the display, or at both the μLEDs and the target substrate.

In some embodiments, a stimulating material may be applied to either of the μLEDs or the target substrate and the bonding material may be applied to the other of the μLEDs or the target substrate. The stimulating material may configured to cause bonding of the μLEDs to the target substrate when the stimulating material is brought into contact with the bonding material.

In some embodiments, the bonding material is applied to one or more selected μLEDs and/or the target substrate based on a predefined sequence or pattern. This may allow the position and/or the size of the gaps or spaces between μLEDs remaining on the carrier substrate to be modified. Modifying the positioning and/or size of the gaps or spaces between the remaining μLEDs facilitates alignment between the carrier substrate and a populated target substrate.

Figure 9A:
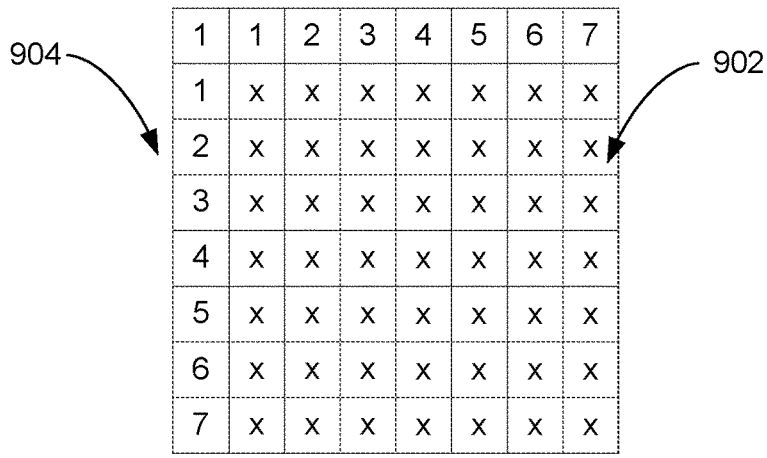
FIGS. 9A through 9C are schematic representations of a carrier substrate over multiple bonding cycles, in accordance with one embodiment.
Figure 9B:
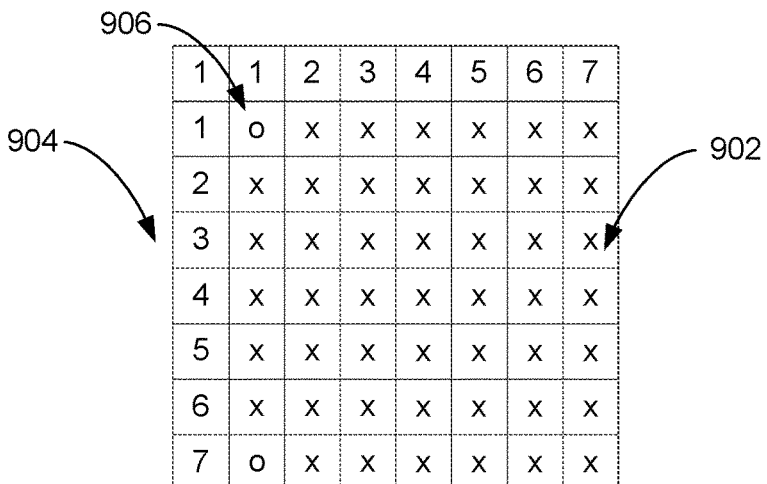
Figure 9C:
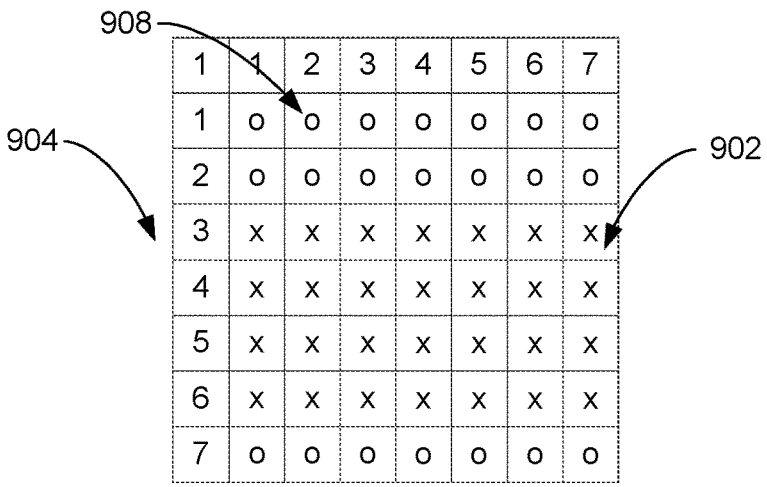

FIG. 9A shows an array of μLED dies 902 (each μLED die being indicated by a corresponding "x") positioned on a carrier substrate 904. FIG. 9B shows the carrier substrate 904 of FIG. 9A after a first bonding cycle, during which two μLEDs of the array of μLEDs 902 have been bonded to a target substrate (not shown), as described above. This results in the formation of two gaps or spaces 906 (each space left by a μLED indicated by a corresponding "o") on the carrier substrate 904. After repeated use of the carrier substrate 904, the size of the gaps or spaces 908 is increased based on μLEDs being removed from the carrier substrate 904, as shown in FIG. 9C. This increased size of the gaps or spaces 908 may facilitate alignment of the μLEDs 902 on the carrier substrate 904 relative to one or more in situ μLEDs on a populated target substrate. The possibility of spatial interference during alignment between the μLEDs 902 on the carrier substrate 904 and the in situ μLEDs on the target substrate is reduced because of the increased size of the gaps or spaces 908.

Figure 10:
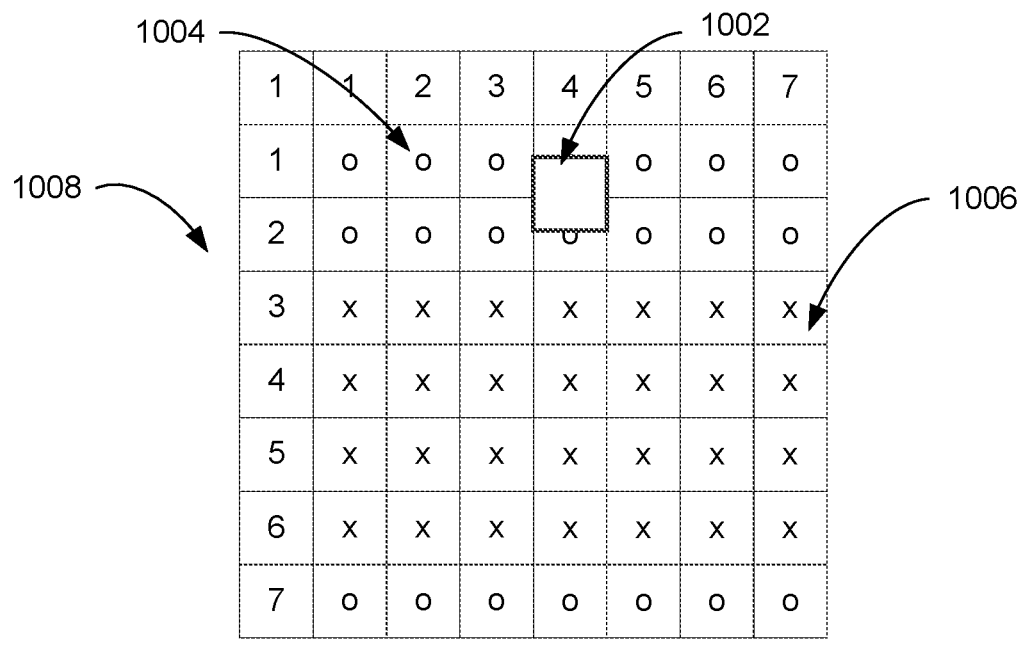

FIG. 10 is a schematic representation of an alignment of an in situ μLED on a target substrate relative to the remaining μLEDs on a carrier substrate. During a direct bonding, the location of the in situ μLED 1002 on a target substrate (not shown) corresponds to a location of a gap or space 1004 between the remaining μLED 1006 on the carrier substrate 1008.

In some embodiments, a processor of a computing device may be configured to perform or facilitate the performance any of the above described methods. For example, the computing device may be part of a LED assembly system. The processor may be configured by a computer program stored on a computer readable medium to perform the methods.

The foregoing description of the embodiments has been presented for the purpose of illustration; it is not intended to be exhaustive or to limit the patent rights to the precise forms disclosed. Many modifications and variations are possible in light of the above disclosure.

The language used in the specification has been principally selected for readability and instructional purposes, and it may not have been selected to delineate or circumscribe the disclosed subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method for manufacturing a device, comprising:
    applying a bonding material to a subset of light emitting diode (LED) dies on a carrier substrate or to locations on a target substrate corresponding to the subset of LED dies, the bonding material providing an adhesive force between the subset of LED dies and the target substrate that is greater than an adhesive force between the subset of LED dies and the carrier substrate;
    subsequent to applying the bonding material, contacting the subset of LED dies and the target substrate such that the bonding material is between the subset of LED dies on the carrier substrate and the locations on the target substrate;
    bonding the subset of LED dies to the target substrate with the bonding material;

separating the target substrate and the carrier substrate to transfer the subset of LED dies to the target substrate; and subsequent to separating the target substrate and the carrier substrate:
applying a second bonding material to a second subset of LED dies on the carrier substrate or to second locations on a second target substrate;
aligning in situ dies on the second target substrate with first spaces on the carrier substrate, the first spaces on the carrier substrate created by the transfer of the first subset of LED dies from the carrier substrate;
contacting the second subset of LED dies and the second target substrate such that the second bonding material is between the second subset of LED dies on the carrier substrate and the second locations on the second target substrate;
bonding the second subset of LED dies to the second target substrate with the second bonding material; and
separating the second target substrate and the carrier substrate such that the second subset of LED dies are transferred to the second target substrate.

2. The method of claim 1, wherein the locations on the target substrate include electrical contacts for the subset of LED dies and the target substrate includes electrical connections connected to the electrical contacts that provide power to the subset of dies bonded to the target substrate.

3. The method of claim 1, wherein the target substrate is a display substrate including a thin film transistor (TFT) backplane.

4. The method of claim 1, wherein the subset of LED dies includes an array of LED dies on the carrier substrate.

5. The method of claim 1, wherein the LED dies each include an active light emitting area that is less than 2,000 µm$^2$.

6. The method of claim 1, further comprising fabricating the LED dies on the carrier substrate.

7. The method of claim 1, further comprising:
prior to contacting the subset of LED dies and the target substrate, applying a stimulating material to one of the subset of LED dies on the carrier substrate or the locations on the target substrate without the bonding material; and
bonding the subset of LED dies to the target substrate by contacting the stimulating material with the bonding material.

8. The method of claim 1, wherein applying the bonding material to the subset of LED dies or to the locations on the target substrate include using:
laser induced forward transfer;
inkjet printing;
electroplating;
electroless plating;
screen printing;
self-assembly; or
transfer printing.

9. The method of claim 1, further comprising:
fabricating LED dies including the subset of LED dies on the carrier substrate;
applying a compliant layer to the LED dies on the carrier substrate;
subsequent to applying the compliant layer, debonding the LED dies from the carrier substrate; and
prior to applying the bonding material to the subset of LED dies, separating the compliant layer and the LED dies.

10. The method of claim 1, wherein the bonding material is a conductive material.

11. The method of claim 1, wherein the subset of LED dies transferred to the target substrate each forms a sub-pixel of a pixel.

12. The method of claim 1, further comprising, subsequent to separating the second target substrate and the carrier substrate:
applying a third bonding material to a third subset of LED dies on the carrier substrate or to third locations on a third target substrate;
aligning in situ dies on the third target substrate with the first spaces on the carrier substrate or the second spaces on the carrier substrate, the second spaces on the carrier substrate created by the transfer of the second subset of LED dies from the carrier substrate;
contacting the third subset of LED dies and the third target substrate such that the third bonding material is between the third subset of LED dies on the carrier substrate and the third locations on the third target substrate;
bonding the third subset of LED dies to the third target substrate with the third bonding material; and
separating the third target substrate and the carrier substrate such that the third subset of LED dies are transferred to the third target substrate.

13. The method of claim 12, wherein the third target substrate is the target substrate and the in situ dies on the third target substrate include the subset of LED dies previously bonded to the target substrate.

14. The method of claim 1, further comprising changing the adhesive force between the subset of LED dies and the target substrate to be greater than the adhesive force between the subset of LED dies and the carrier substrate after contacting the carrier substrate and the target substrate.

15. The method of claim 14, wherein changing the adhesive force between the subset of LED dies and the target substrate includes at least one of irradiating the bonding material, heating the bonding material or applying a pressure on the bonding material.

16. The method of claim 1, further comprising changing the adhesive force between the subset of LED dies and the carrier substrate to be less than the adhesive force between the subset of LED dies and the target substrate after contacting the carrier substrate and the target substrate.

17. The method of claim 16, wherein changing the adhesive force between the subset of LED dies and the carrier substrate includes at least one of:
irradiating the bonding material between the subset of LED dies and the locations on the carrier substrate;
heating the bonding material between the subset of LED dies and the locations on the carrier substrate; or
applying a pressure to the bonding material between the subset of LED dies and the locations on the carrier substrate.

18. A method of manufacturing a device, comprising:
manufacturing light emitting diode (LED) dies on a carrier substrate;
transferring a first LED die on the carrier substrate to a target substrate having no in situ LED dies by contacting the first LED die on the carrier substrate with the target substrate, the transfer of the first LED die creating a space on the carrier substrate;
aligning an in situ die on a second target substrate with the space on the carrier substrate; and
transferring a second LED die on the carrier substrate to the second target substrate by contacting the second LED die on the carrier substrate with the second target substrate with the in situ die on the second target substrate aligned with the space on the carrier substrate.

19. The method of claim 18, further comprising:

subsequent to transferring the first LED die to the target substrate and prior to transferring the second LED die to the second target substrate, transferring a third LED die on the carrier substrate to a third target substrate by contacting the third LED die on the carrier substrate with the third target substrate, the transfer of the third LED die creating a second space on the carrier substrate; and aligning a second in situ die on the second target substrate with the second space on the carrier substrate; and wherein transferring the second LED die to the second target substrate includes contacting the second LED die on the carrier substrate with the second target substrate with the second in situ die on the second target substrate aligned with the second space on the carrier substrate.

20. The method of claim 18, wherein:

the LED dies on the carrier substrate are first color LED dies; and the in situ die on the second target substrate is a second color LED die.

* * * * *